April 14, 1959 A. T. IRELAND 2,882,402
TRANSISTOR OSCILLATOR
Filed April 4, 1956
Fig. 1.
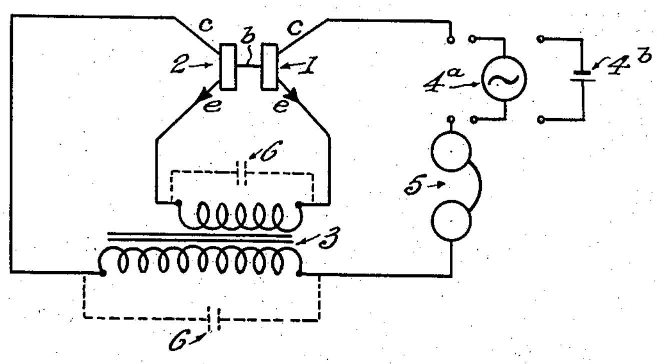
Fig. 2.
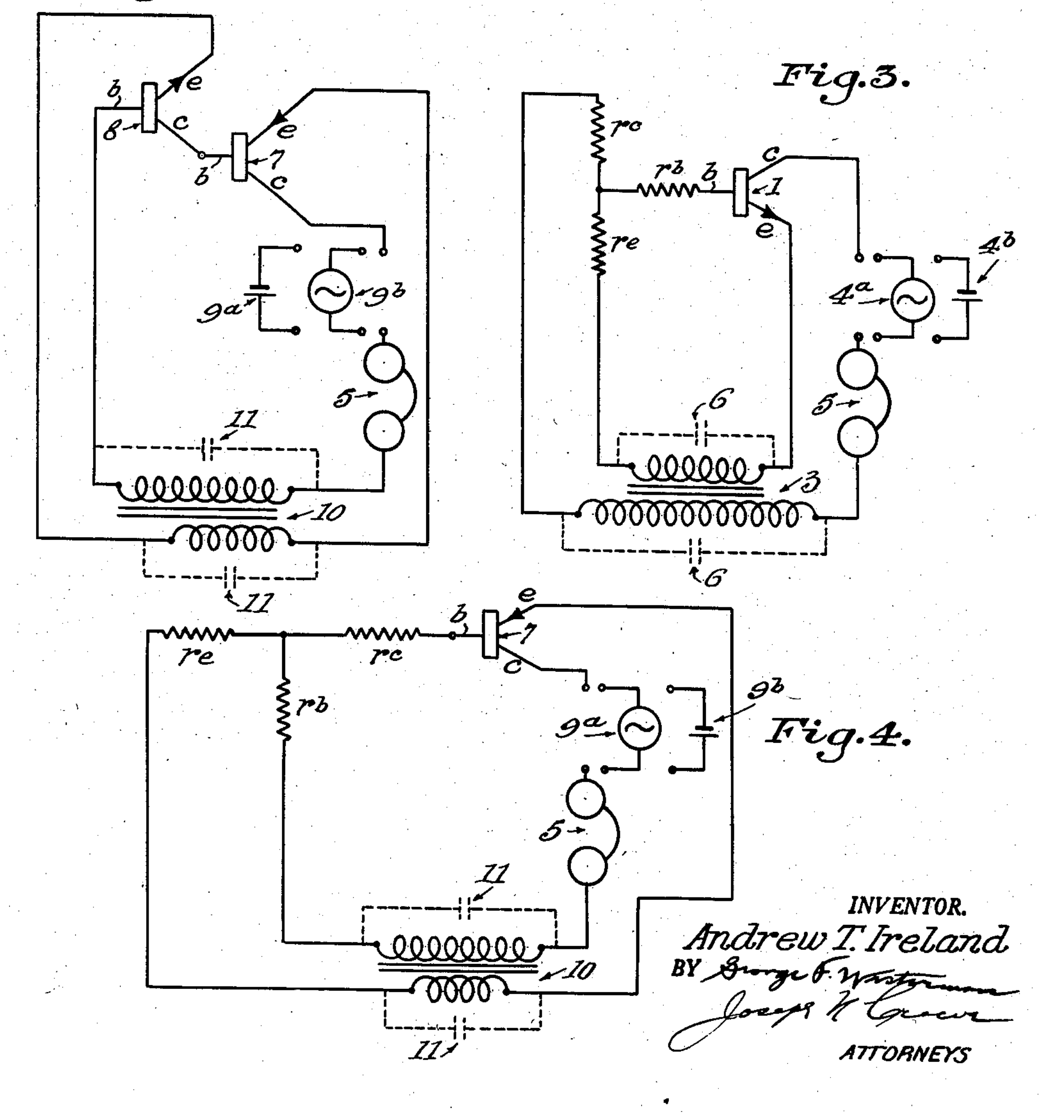
Fig. 2. Fig. 3. Fig. 4.
INVENTOR.
Andrew T. Ireland
BY George F. Westerman
Joseph V. Gower
ATTORNEYS United States Patent Office 2,882,402

Patented Apr. 14, 1959

2,882,402

TRANSISTOR OSCILLATOR

Andrew T. Ireland, Falls Church, Va., assignor to the United States of America as represented by the Secretary of the Army Application April 4, 1956, Serial No. 576,222

20 Claims. (Cl. 250—36)

(Granted under Title 35, U.S. Code (1952), sec. 266)

The invention described herein may be manufactured and used by or for the Government for governmental purposes without the payment of any royalty thereon.

The present invention relates to the generation of oscillations and more particularly to an audio oscillator employing a plurality of semi-conductive devices wherein either an A.C. or D.C. input control signal is applied to trigger the operation of the circuit. Such semi-conductive devices may be either the PNP or NPN junction or point contact type of transistors. The basic theory and operation of transistors has been described in textbooks and publications readily available to one skilled in the art and therefore need not be treated herein. The discussion herein will therefore be limited to transistor operation only insofar as is necessary to describe the operation of the novel oscillator of the instant disclosure.

It is well known that transistors will oscillate readily and that any transistor amplifier can be made to oscillate by feeding a portion of its output energy through various arrangements of circuit components, back to the input circuit so that an in phase or positive feedback signal is obtained. It is also well known that transistors operate satisfactorily as oscillators with low power and are useful in many applications where their relatively low power output is satisfactory. Many circuit arrangements for transistor oscillators are shown in the literature, including audio oscillators using a single transistor with either A.C. or D.C. input control signals.

It is an object of the present invention to provide a novel transistor audio oscillator, having a pair of either junction or point contact type transistors to which either an A.C. or D.C. input signal may be applied without regard to polarity of the input signal.

It is a further object of the present invention to provide an audio oscillator employing a pair of junction or point contact type transistors wherein when an A.C. input signal is applied said transistors will function alternately in accordance with the polarity of the A.C. input signal, the non-functioning transistor acting as a low value resistor in the feedback circuit.

It is a further object of the present invention to provide an audio oscillator employing a pair of junction or point contact type transistors wherein when a D.C. input signal is applied the polarity of said D.C. input signal will selectively determine which one of said pair will function, the non-functioning one of said pair of transistors acting as a low value resistor in the feedback circuit.

It is a further object of the instant invention to provide an audio oscillator employing a pair of junction or point contact type transistors wherein the pitch of the audio oscillations indicates the polarity or direction of the D.C. input signal applied.

It is also an object of the present invention to provide an audio oscillator employing a pair of junction or point contact type transistors wherein a variable pitch output may be obtained from a single A.C. input signal.

It is a further object of the present invention to provide a transistor oscillator employing a pair of transistors of similar configuration or complementary configuration to which either an A.C. or D.C. input signal may be applied for the selective control of the transistors in the oscillator.

These and other objects will become apparent to those skilled in the art from the following description wherein—

Fig. 1 is a circuit diagram of an audio oscillator employing a pair of junction type transistors having similar configuration and coupled in base-to-base connection;

Fig. 2 is a circuit diagram of an audio oscillator employing a pair of junction type transistors having dissimilar configuration and direct-coupled in base-to-collector connection;

Fig. 3 is a circuit diagram equivalent to the audio oscillator of Fig. 1 and is representative of the change effected in the circuit components of Fig. 1 when an A.C. or D.C. input signal is applied; and Fig. 4 is a circuit diagram equivalent to the audio oscillator of Fig. 2 and is representative of the change effected in the circuit components of Fig. 2 when an A.C. or D.C. input signal is applied.

Reference is now made to the audio oscillator in Fig. 1 wherein a pair of transistors shown generally at 1 and 2 are connected in a base-to-base relation. The letters *c*, *e*, and *b* as shown on the drawings are conventional and designate the collector, emitter, and base of a transistor, respectively. The terms $r_c$, $r_e$ and $r_b$ associated with the resistances as shown in Figs. 3 and 4 represent the total resistance associated with the collector, emitter, and base electrodes, respectively. The transistors 1 and 2 may be either of the point contact or junction type. When point contact type transistors are used the circuit constants must be changed to provide proper impedance matching between input and output circuits and inductance and capacity values since the electrical characteristics of point contact transistors differ from those of the junction type. When the latter are used both are either of the NPN or PNP configuration. An audio transformer 3 provides positive in-phase feedback to sustain oscillation and must be properly poled. The transformer 3 should have a high turns ratio to match the high output resistance at the collector electrode to the low input resistance at the emitter electrode. An input signal source, which may be either A.C. as shown at 4*a*, or D.C. as represented by 4*b*, is connected to apply the input signal to the collector electrode of transistor 1. However, the input signal could be connected instead to the collector electrode of transistor 2, the effect of which on the operation of the circuit will be hereinafter described. A pair of earphones 5 or other indicating means, such as a meter, is used to provide an audible or visual indication. The frequency of the oscillations is determined by the electrical characteristics of the transistors, the inductance and capacitance of the windings of the audio transformer and the input signal impedance. If it is desired to vary the frequency or select a particular frequency, a condenser, fixed or variable, may be connected across the primary or secondary or both windings of the audio transformer as shown at 6.

In operation, the input signal modulates the frequency of the audio oscillator as determined by the input signal impedance, transistors and the audio transformer. When an A.C. input signal is applied as shown in Fig. 1, the transistors 1 and 2 will function alternately on each half cycle, the non-functioning transistor acting as a low value resistor. The equivalent circuit under these conditions, for example, for the connections shown in Fig. 1 and when transistor 1 is functioning, is shown in Fig. 3. If transistors 1 and 2 each have different values of impedance, the pitch of the audio oscillations on each half cycle will change depending upon which transistor is functioning. This feature permits determining the polarity of a D.C. input signal, since depending on the polarity, one or the other transistor will function and by the pitch of audio oscillations, the direction of current flow may be known. If a D.C. input signal of proper polarity is applied, for example, to transistor 1 as shown in Fig. 1, transistor 2 will act as a low value resistor as shown in the equivalent circuit in Fig. 3 and the pitch of the modulated audio oscillations will depend on the electrical characteristics of transistor 1, the audio transformer windings, and the input signal impedance. If the polarity of the D.C. input signal is reversed, transistor 2 will function and transistor 1 will act as a low value resistor, the reverse of the circuit shown in Fig. 3, and the pitch of the modulated audio oscillations will depend on the electrical characteristics of transistor 2, the windings of the audio transformer, and the input signal impedance.

One specific embodiment of the circuit shown in Fig. 1 employed two Western Electric 2N27 transistors and a UTC SSO3 transistor audio transformer having an output impedance of 25,000 ohms. The frequency of audio oscillations which may be obtained from an arrangement as in Fig. 1 will range from 1000 to 2000 cycles per second without benefit of any frequency determining components other than the audio transformer. This audio oscillator operated satisfactorily when triggered by 10 to 30 cycle alternating current having peak values as low as 0.15 volt and power as low as ¾ microwatt.

Another embodiment employing the novel features of the instant invention is represented in the circuit diagram shown in Fig. 2 wherein two junction type transistors of dissimilar configuration, one NPN and one PNP, are used. Again, if PNP and NPN type transistors such as 7 and 8, with different input and output impedances are used, differences in pitch of the modulated audio oscillations result. Thus, when D.C. input signals are applied to the collector electrode, an indication may be obtained by the difference in pitch as to the polarity of the D.C. input signal. The frequency of the audio oscillations may also be selected, as in the circuit of Fig. 1, by addition of capacitance across the windings of transformer 10 as at 11. The circuit components in this embodiment are similar to those used in the embodiment of Fig. 1. A signal input source which may be A.C. as at **9*a* or D.C. as represented at 9*b*, is applied to the collector electrode of transistor 7, a PNP junction type to modulate the audio oscillations. The base electrode of the PNP transistor 7 is connected to the collector electrode of the NPN transistor 8**.

The complementary characteristics of the PNP and NPN type transistors may be employed, as in Fig. 2, to utilize the opposite action of the two types. The direct coupling is enabled by the fact that an increasing collector current of transistor 8 and therefore an increasing base current in transistor 7 causes decreasing collector current in transistor 7 and vice versa.

While the circuits of Figs. 1, 2, 3, and 4 show oscillators employing an audio transformer, it is to be understood that the novel circuit arrangement may also be practiced in connection with radio-frequency oscillators. The only change required would be to substitute an air-core inductance or air-core transformer instead of the iron core transformer 3 or 10 in Figs. 1 and 2, respectively. Feedback would be provided through such air-core inductance or the primary winding of the air-core transformer. The output of the oscillator could be coupled to the input of an amplifier or other load by any of the conventional methods of coupling radio-frequency energy which are well known to those skilled in the art.

As is well known, any transistor amplifier can be made to oscillate by feeding back a portion of the output to the input circuit in proper phase. The amplifying properties of transistors stem from the fact that they have low input and high output impedances. The transistor is basically a current operated device and operates as a current amplifier and prefers a constant current power supply.

In transistors, the emitter electrode when D.C. biased for forwarded current flow, effectively injects or emits current carriers, electrons or holes (positive charges) into the center base region. The collector, when D.C. biased for reverse current flow, apparently collects current carriers, electrons or holes, which then increase the reverse current. In NPN transistors, as shown in the figures in the drawing, the injected carriers are electrons from the N-type emitter layer; in the PNP-type, they are holes from the P-type emitter layer. The movement of these injected electrons or holes through the solid body of a semiconductor, such as a transistor, constitutes a current flow which can be modulated by a signal voltage. In a transistor, signal energy is required to modulate the injection of current carriers into the base region, electrons in the case of NPN types such as in Fig. 1 and transistor 8 in Fig. 2 and holes in the case of PNP type such as at 7 in Fig. 2.

In Fig. 1 with NPN type transistors, the N-type emitter injects electrons into the base region which are attracted to the collector. When the A.C. signal applied to the collector of transistor 1 is positive, the flow or drift of electrons is increased, and when the signal is negative, the drift is reduced; the signal energy modulates the injection of carriers to modulate the carrier current. When the current is increased in transistor 1, sufficient output is available to provide feedback through the audio transformer 3 to sustain oscillation of transistor 1. It may be necessary to reverse the terminals of the secondary of the audio transformer to obtain proper polarity for positive feedback. When the current flow through transistor 1 is increased on the positive half cycle the current flow through the base of transistor 1 increases and since transistors 1 and 2 are connected base-to-base, the current in the base electrode of transistor 2 will be increased in a direction to oppose the flow of electrons from the emitter to the collector in transistor 2, since such current flow consists of electrons and follows the low impedance path through the emitter electrode and through the audio transformer primary. Since current flow in the transformer is such as to provide feedback to transistor 1 only during the positive portion of a cycle, audio oscillations will be produced only by transistor 1 and be modulated by the applied signal. The reversal of the applied signal to the collector electrode has the effect of applying a bias for forward or reverse current flow. Upon reversal of the cycle of the applied A.C. signal, on the negative half, the collector electrode of transistor 1 being negative, the flow of electrons from the emitter is reduced and the base current is also reduced. Since the transistors 1 and 2 are connected base-to-base, the reduction in base current in transistor 1 results in a reduced base current in transistor 2 and an increased current from the emitter electrode to the collector electrode of transistor 2 which causes transistor 2 to function whereas transistor 1 is not functioning. The functioning of transistor 2 causes current to flow in a direction in transformer 3 so as to apply in phase feedback to transistor 2 to sustain oscillation which is modulated by the signal input. It is seen that as the cycle of the A.C. input signal alternates, the functioning of transistors 1 and 2 alternates.

When a D.C. input signal is applied to the circuit of Fig. 1 and if the collector electrode of transistor 1 is negative, the collector electrode of transistor 2 will be positive and vice versa. The transistor having the positive collector will function and the other one will act as a low value resistor as shown in the example in Fig. 3. The circuit thus may be used as a polarity indicator.

In the circuit shown in Fig. 2 a PNP and NPN junction type transistor are directly coupled. In PNP type transistors the P-type emitter injects holes (positive charges) into the base region which are attracted by a strong negative field to the collector. When the A.C. input signal is on the positive half cycle, the flow or drift of holes to the collector is decreased and the current flowing in the base electrode of transistor 7 is decreased, which due to the direct connection causes a decreased current flow (electrons) in the collector electrode of NPN type transistor 8. With this decreased electron flow in the collector of transistor 8, electrons are attracted to the collector of this NPN transistor and current flow in the oscillator circuit is through the low impedance emitter electrode and through the primary of the audio transformer. If the transformer is properly poled for in phase feedback, energy is applied to transistor 8 to sustain oscillation. On the negative portion of the cycle, transistor 7 collector attracts holes or positive carriers from the emitter and current (electrons) are increased in the base electrode of transistor 7. Due to direct coupling the electron flow in the collector of transistor 8 is increased opposing the flow of electrons from the emitter through the base region to the collector of this transistor which therefore is nonfunctioning. Since the external circuit current flow is now reversed, in phase feedback is applied to transistor 7 to sustain oscillation which is modulated by the A.C. input signal. It is seen that as the cycle reverses, alternate functioning of the transistors takes place.

If a D.C. input signal is applied, depending on the direction of polarity, one or the other transistor, 7 or 8, will function, based on the operation as outlined in detail for an A.C. signal above. Here again the polarity of the input signal may be determined by which transistor is functioning. Equivalent circuits in which the non-functioning transistors 2 and 8 are shown as an equivalent low resistance network are illustrated in Figs. 3 and 4, respectively. If transistors 2 and 8 are functioning, then transistors 1 and 7 would be represented by an equivalent low resistance network.

Having thus described my invention, what I claim as new and wish to secure by Letters Patent is:

1. An oscillator comprising a plurality of semi-conductive devices electrically interconnected for interdependent operation, means connecting the outputs of said plurality of semi-conductive devices to the inputs thereof for supplying a portion of the output energy of said semi-conductive devices to the inputs thereof, a signal input source and signaling means serially connected in the output of one of said plurality of interconnected semi-conductive devices, said signal input source selectively controlling the operation of said semi-conductive devices by the polarity of the input signal and simultaneously modulating the oscillations produced by said devices, said signaling means being responsive to the modulated oscillations produced by said semi-conductive devices.

2. An oscillator comprising a first and a second transistor each including a base electrode, said first and second transistors being connected in base-to-base relation, reactance means coupling the output of said first and second transistors to the inputs thereof for supplying a portion of the output energy of said transistors to the inputs thereof in proper phase relation to sustain oscillation of said transistors, means connected to said reactance means for determining the frequency of oscillation of said transistors, a signal input source and signaling means serially connected in the output circuit of a first one of said transistors for selectively controlling the operation of said first and second transistors by the polarity of the input signal and simultaneously modulating the oscillations produced by said devices, said signaling means connected to said first and second transistors being responsive to the modulated oscillations produced by said first and second transistors.

3. An oscillator comprising first and second transistors each having a base, an emitter and a collector electrode, the base electrodes of said first and second transistors being interconnected, feedback means electrically coupling the emitter electrodes to the collector electrodes of said first and second transistors for selectively returning a portion of the output energy of said first and second transistors to the inputs thereof in proper phase relation to sustain oscillation, means connected to said feedback means for determining the frequency of oscillations of said first and second transistors, a signal input source and signaling means serially connected between the collector electrode of said first transistor and the portion of said feedback means connected to said collector electrodes, said signal input source selectively controlling the operation of said first and second transistors by the polarity of the input signal and simultaneously modulating the oscillations produced by said first and second transistors, said signaling means being responsive to the modulated oscillations produced by said first and second transistors.

4. An oscillator comprising first and second transistors each having a base, an emitter and a collector electrode, the base electrode of said first transistor connected directly to the base electrode of said second transistor, transformer means having primary and secondary windings electrically coupling the emitter electrodes of said first and second transistors to the collector electrodes thereof for selectively returning a portion of the output energy of said first and second transistors to the inputs thereof in proper phase relation to sustain oscillation, the primary winding of said transformer being connected between the emitter electrodes and the secondary winding being connected between the collector electrodes of said first and second transistors, capacitor means connected to the primary and secondary windings of said transformer for determining the frequency of oscillations of said first and second transistors, an alternating current signal input source connected between the collector electrode of said first transistor and the secondary winding of said transformer for alternately controlling the oscillation of said first and second transistor by the changing polarity of the input signal and simultaneously modulating the oscillations produced by said first and second transistors and means serially connected between said input signal source and the secondary winding of said transformer responsive to the modulated oscillations produced by said first and second transistors.

5. An oscillator as recited in claim 4 wherein said capacitor means is connected in series with each of the windings of said transformer.

6. An oscillator as recited in claim 4 wherein said capacitor means is connected in shunt with each of the windings of said transformer.

7. An oscillator as recited in claim 4 wherein said first and second transistors have mutually distinct impedance characteristics whereby the pitch of the modulated oscillations produced will be mutually distinct.

8. An oscillator as recited in claim 4 wherein each of said first and second transistors are of the NPN junction type configuration.

9. An oscillator as recited in claim 4 wherein each of said first and second transistors are of the PNP junction type configuration.

10. An oscillator as recited in claim 4 wherein each of said first and second transistors are of the point contact type configuration.

11. An oscillator comprising first and second transistors each having a base, an emitter and a collector electrode, the base electrode of said first transistor being connected directly to the base electrode of said second transistor, the emitter and collector electrode of said first transistor being electrically connected through coupling means to corresponding electrodes of said second transistor for returning a portion of the output of said first and second transistors to the inputs thereof to sustain oscillation, a direct current signal source connected between the collector electrode of said first transistor and the portion of said coupling means connected to the collector electrode of said second transistor, said input signal source selectively controlling the oscillations of said first and second transistors by the polarity of the input signal and means responsive to oscillations produced by said selectively controlled first and second transistors.

12. An oscillator as recited in claim 11 wherein said first and second transistors have mutually differing impedance characteristics whereby a difference in pitch of the oscillations will be produced by said selectively controlled first and second transistors.

13. An oscillator comprising a pair of transistors each having a base, an emitter and a collector electrode, the base electrode of a first one of said pair of transistors connected directly to the collector electrode of a second one of said pair of transistors, means electrically coupling the emitter electrodes of said pair of transistors to the collector electrode of said first one of said pair of transistors and the base electrode of said second one of said pair of transistors for selectively returning a portion of the output energy of said first and second transistors to the inputs thereof in proper phase relation to sustain oscillation, a signal input source connected between the collector electrode of said first one of said pair of transistors and a portion of said coupling means for selectively controlling the oscillation of said pair of transistors by the direction of polarity of said signal source and simultaneously modulating the oscillations produced by said first and second transistors, reactance means connected to said coupling means for determining the frequency of oscillation of said pair of transistors and means connected between said input signal source and said portion of said coupling means responsive to the modulated oscillations produced by said pair of transistors.

14. An oscillator comprising a pair of transistors each having a base, an emitter and a collector electrode, the base electrode of a first one of said pair of transistors connected directly to the collector electrode of a second one of said pair of transistors, transformer means having primary and secondary windings electrically coupling the emitter electrodes of said pair of transistors to the collector electrode of said first one of said pair of transistors and the base electrode of said second one of said pair of transistors for selectively returning a portion of the output energy of said first and second transistors to the inputs thereof in proper phase relation to sustain oscillation, the primary winding of said transformer being connected between the emitter electrodes of said pair of transistors and the secondary winding being connected between the collector electrode of said first one of said pair of transistors and the base electrode of said second one of said pair of transistors, capacitor means connected to the primary and secondary windings of said transformer for determining the frequency of oscillations of said first and second transistors, an alternating current signal input source connected between the collector electrode of said first of said pair of transistors and the secondary winding of said transformer for alternately controlling the oscillation of said first and second transistors by the changing polarity of the input signal and simultaneously modulating the oscillations produced by said alternately controlled first and second transistors and means serially connected between said input signal source and the secondary winding of said transformer responsive to the modulated oscillations produced by said first and second transistors.

15. An oscillator as recited in claim 14 wherein said capacitor means is connected in series with each of the windings of said transformer.

16. An oscillator as recited in claim 14 wherein said capacitor means is connected in shunt with each of the windings of said transformer.

17. An oscillator as recited in claim 14 wherein said pair of transistors have complementary characteristics and mutually differing impedance characteristics whereby the pitch of the modulated oscillations produced will be mutually distinct.

18. An oscillator as recited in claim 14 wherein said first one of said pair of transistors is a PNP type junction transistor and said second one of said pair is an NPN type junction transistor.

19. An oscillator as recited in claim 14 wherein said pair of transistors are of the point contact configuration.

20. An oscillator comprising first and second transistors each having a base, an emitter and a collector electrode, the base electrode of said first transistor connected directly to the collector electrode of said second transistor, means electrically coupling the emitter electrodes of said first and second transistors to the collector electrode of said first transistor and the base electrode of said second transistor for returning a portion of the output of said first and second transistors to the inputs thereof to sustain oscillation, a direct current signal source connected between the collector electrode of said first transistor and the portion of said coupling means connected to the base electrode of said second transistor, said input signal source selectively controlling the oscillations of said first and second transistors by the polarity of the input signal and means responsive to oscillations produced by said selectively controlled first and second transistors.

References Cited in the file of this patent

UNITED STATES PATENTS

| | | |
|---|---|---|
| 1,947,805 | Scofield | Feb. 20, 1934 |
| 2,759,104 | Skellett | Aug. 14, 1956 |
| 2,764,643 | Sulzer | Sept. 25, 1956 |
| 2,774,878 | Jensen | Dec. 18, 1956 |
| 2,776,372 | Ensink et al. | Jan. 1, 1957 |